United States Patent [19]

Pankove

[11] 3,783,353

[45] Jan. 1, 1974

[54] ELECTROLUMINESCENT SEMICONDUCTOR DEVICE CAPABLE OF EMITTING LIGHT OF THREE DIFFERENT WAVELENGTHS

[75] Inventor: Jacques Isaac Pankove, Princeton, N.J.

[73] Assignee: RCA Corporation, New York, N.Y.

[22] Filed: Oct. 27, 1972

[21] Appl. No.: 301,468

[52] U.S. Cl. .. 317/235 R, 317/235 N, 317/235 AC, 313/108 D

[51] Int. Cl. .......................................... H05b 33/00

[58] Field of Search ................. 317/235 N, 235 AC

[56] References Cited

UNITED STATES PATENTS

| | | | |
|---|---|---|---|
| 3,727,115 | 4/1973 | Shang | 317/235 R |
| 3,611,069 | 10/1971 | Galginaitis | 317/235 R |
| 3,683,240 | 8/1972 | Pankove | 317/235 R |

*Primary Examiner*—Martin H. Edlow
*Attorney*—Glenn H. Bruestle et al.

[57] ABSTRACT

An electroluminescent semiconductor device includes a transparent substrate having mounted on one surface a body of insulating crystalline gallium nitride and on its other surface a semiconductor diode which is capable of emitting red light. Contacts are provided for the gallium nitride body and the diode with one contact being common to each. When a voltage is applied across the gallium nitride body either blue or green light is emitted depending on the polarity of the voltage. When a voltage is applied across the diode, red light is emitted. All three colors of the emitted light can be seen through one surface of the gallium nitride body. A plurality of the electroluminescent semiconductor devices can be formed in an array to provide a flat display panel.

10 Claims, 6 Drawing Figures

ELECTROLUMINESCENT SEMICONDUCTOR DEVICE CAPABLE OF EMITTING LIGHT OF THREE DIFFERENT WAVELENGTHS

BACKGROUND OF THE INVENTION

The present invention relates to an electroluminescent semiconductor device which is capable of emitting light of three different wavelengths, e.g., blue, green and red light, and which can be made into an array to form a flat display panel.

Electroluminescent semiconductor devices in general are bodies of a single crystalline semiconductor material which when biased emit light, either visible or infrared, through the recombination of pairs of oppositely charged carriers. Such semiconductors have been made of the group III–V compound semiconductor materials, such as the phosphides, arsenides and antimonides of aluminum, gallium, and indium, and combinations of these materials, because the high-band gap energy of these materials allows emission of visible and near infrared radiation. The particular wavelength of the emitted light depends on the particular semiconductor material used to make the device. For example, gallium arsenide emits infrared radiation; gallium phosphide can emit either red or green light; gallium arsenide phosphide can emit red light; gallium nitride can emit either blue or green light; and gallium aluminum arsenide can emit either infrared or yellow light.

A plurality of the electroluminescent semiconductor devices can be mounted together in an array to provide a flat, electroluminescent display panel. For such a display panel it would be desirable to have an electroluminescent semiconductor device which could emit more than one color of light, particularly the set of primary colors red, blue and green. Also, it would be desirable to have such an electroluminescent semiconductor device in which each of the colors is emitted from substantially the same point on the surface of the device.

SUMMARY OF THE INVENTION

An electroluminescent semiconductor device includes a first body of a crystalline semiconductor material which is capable of emitting light when a voltage is placed thereacross with the emitted light being of one wavelength when the voltage is in one direction across the body and being of a second wavelength when the voltage is in the opposite direction and a second body of a semiconductor material which is capable of emitting light of a third wavelength when a voltage is placed thereacross. The second body is secured to the first body. A first contact is connected to the first body, a second contact is connected to the second body, and a third contact is connected to both the first body and the second body in spaced relation to the first and second contacts. The electroluminescent semiconductor device is capable of emitting light of at least three different wavelengths.

DETAILED DESCRIPTION

Figure 1:
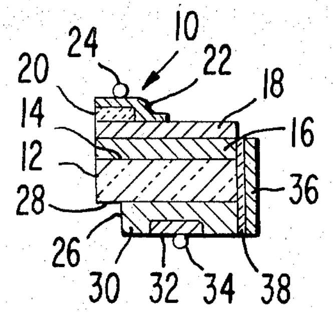
FIG. 1 is a sectional view of one form of the electroluminescent semiconductor device of the present invention.
Figure 2:
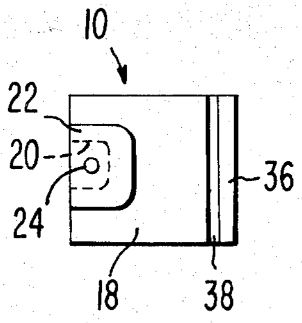
FIG. 2 is a top view of the electroluminescent semiconductor device shown in FIG. 1.
Figure 3:
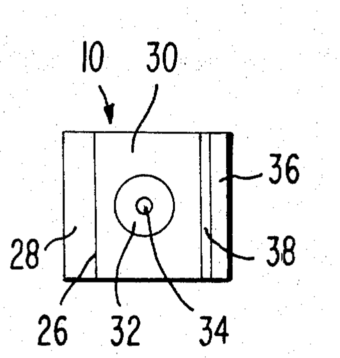
FIG. 3 is a bottom view of the electroluminescent semiconductor device shown in FIG. 1.

Referring initially to FIGS. 1–3, a form of the electroluminescent semiconductor device of the present invention is generally designated as 10. The electroluminescent semiconductor device 10 comprises a flat substrate 12 of an electrical insulating material which is optically transparent, such as sapphire. On a surface 14 of the substrate 12 is a body 16 of N type conductive crystalline gallium nitride, which has a conductivity of about $10^2$ mhos. On the surface of the conductive gallium nitride body 16 is a body 18 of insulating crystalline gallium nitride. The gallium nitride bodies 16 and 18 are epitaxially deposited on the substrate 12, such as by the vapor phase epitaxy technique described in the article "The Preparation and Properties of Vapor-Deposited Single-Crystalline GaN" by H. P. Maruska and J. J. Tietjen published in APPLIED PHYSICS LETTERS, Volume 15, page 327 (1960). During the initial step of the deposition process little or no acceptor impurity is included so that the initial portion of the deposited gallium nitride is conductive to form the conductive gallium nitride body 16. When a conductive gallium nitride body 16 of the desired thickness has been deposited, an acceptor impurity, such as zinc, cadmium, beryllium, magnesium, silicon or germanium is included in the deposited material. A sufficient amount of the acceptor impurity is introduced into the deposited gallium nitride to compensate substantially all of the native donors inherently formed in the gallium nitride. Thus, there is deposited the insulating gallium nitride body 18.

A layer 20 of an electrical insulating material, such as silicon dioxide, aluminum oxide or silicon nitride, is on a small portion of the surface of the insulating gallium nitride body 18 at an edge thereof. A metal contact pad 22 is coated on the insulating layer 20 and extends beyond the edge of the insulating layer to contact the insulating gallium nitride body 18. A small ball 24 of a soft metal, such as indium, is on the contact pad 22 over the insulating layer 20. However, if desired, the insulating layer 20 and contact pad 22 may be eliminated and the small ball 24 placed in direct contact with the body 18.

A body 26 of a single crystalline semiconductor material selected from the group III–V compounds and mixtures thereof is mounted on the other surface 28 of the substrate 12. The body 26 is of a semiconductor material which is capable of emitting light of a color different from that emitted by the insulating gallium nitride body 18 and is preferably of a semiconductor material which will emit red light, such as gallium phosphide, gallium arsenide phosphide or gallium aluminum arsenide. The body 26 has two juxtaposed portions 30 and 32 of opposite conductivity type to provide a PN junction therebetween. Thus, the body 26 is an electroluminescent diode. The diode 26 can be made by starting with a body of the semiconductor material of one conductivity type, either P type or N type, and diffusing into a portion of the body a conductivity modifier of the opposite type. Alternatively, the diode 26 can be made by the method described in U.S. Pat. No. 3,647,579, to I. Ladany, issued Mar. 7, 1972, entitled "Liquid Phase Double Epitaxial Process For Manufacturing Light Emitting Gallium Phosphide Devices." The diode 26 is mounted on the substrate 12 with the portion 30 engaging the substrate and the portion 32 facing away from the substrate. A ball 34 of a soft metal, such as indium, is secured to the portion 32 of the diode 26 to serve as one contact for the diode.

A strip 36 of an electrically conductive metal, such as nickel, extends along an edge of the substrate 12 and overlaps an edge of the conductive gallium nitride body 16 and the portion 30 of the diode 26. The metal strip 36 is secured to the substrate 12, the conductive gallium nitride body 16 and the diode 26 by an electrically conductive solder layer 38. The metal strip 36 serves to mechanically secure the diode 26 to the substrate 12 and as a common electrical contact to the conductive gallium nitride body 16 and the portion 30 of the diode 26.

In the use of the electroluminescent semiconductor device 10, the contacts 22, 34 and 36 are connected across a source of D.C. current. When the current is passed across the insulating gallium nitride body 18 between the contacts 22 and 36 light is emitted from the insulating gallium nitride body 18 which can be seen from the surface of the insulating gallium nitride body 18. If the contact 22 is made negative with respect to the contact 36, blue light is emitted by the insulating gallium nitride body 18. If the contact 22 is made positive with respect to the contact 36, green light is emitted by the insulating gallium nitride body 18.

If a current is passed through the diode 26 between the contacts 34 and 36 so that the PN junction of the diode is forwardly biased, the diode will emit light, preferably red light. Since the substrate 12 is optically transparent and the gallium nitride bodies 16 and 18 are transparent to red light, the red light emitted by the diode 26 can be seen from the surface of the insulating gallium nitride body 18. By connecting the contacts 22, 34 and 36 to the current source through suitable switches, the electroluminescent semiconductor device 10 can be operated to emit blue, green or red light, all of which can be seen from the same surface of the device.

Figure 4:
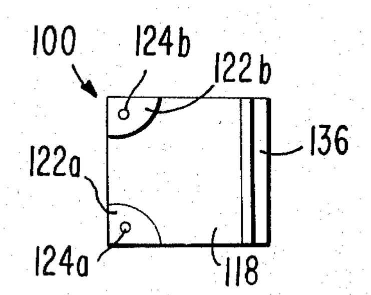
FIG. 4 is a top view of a modification of the electroluminescent semiconductor device shown in FIG. 1.

Referring to FIG. 4, a modification of the electroluminescent semiconductor device of the present invention is generally designated as 100. The electroluminescent semiconductor device 100 is identical to the electroluminescent semiconductor device 10 shown in FIGS. 1–3 except that there are two spaced, metal contact pads **112*a* and 122*b* on the insulating gallium nitride body 118 at the surface of the body. Metal balls 124*a* and 124*b* on the contact pads 122*a* and 122*b* respectively. In the use of this electroluminescent semiconductor device 100, one of the contact pads, such as the contact pad 122*a*, is connected to the current source so as to be negative with regard to the contact 136, and the other contact pad 122*b* is connected to be positive with respect to the contact 136. This provides for greater ease of switching the electroluminescent semiconductor device 100** to achieve either blue or green light.

Figure 5:
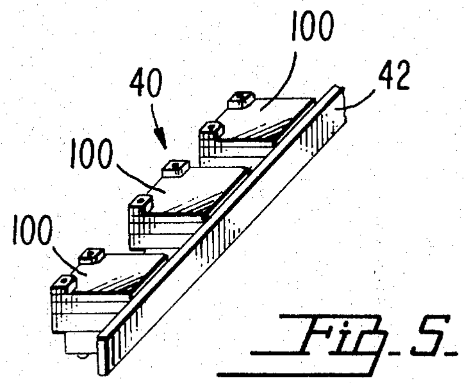
FIG. 5 is a perspective view of an array of a plurality of the electroluminescent semiconductor devices of the type shown in FIG. 4.

Referring to FIG. 5 there is shown an array 40 of a plurality of the electroluminescent semiconductor devices 100. To form the array 40 the electroluminescent semiconductor devices 100 are mounted in spaced relation along an elongated metal strip 42. The metal strip 42 serves as the common electrical contact to the insulating gallium nitride body and the diode of each of the electroluminescent semiconductor devices 100 as well as a common electrode to all of the devices. Thus, in the array 40 a desired color can be emitted from any one of the electroluminescent semiconductor devices 100 individually or from two or more of the devices simultaneously. Although the array 40 is shown as being made up of the electroluminescent semiconductor devices 100 it can also be made up of the electroluminescent semiconductor devices 10 shown in FIGS. 1–3.

Figure 6:
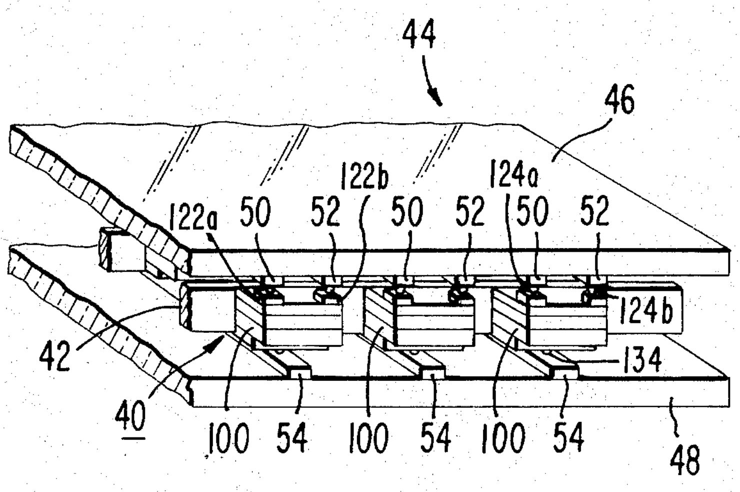
FIG. 6 is a perspective view of a portion of a flat display panel which includes a plurality of the arrays shown in FIG. 5.

Referring to FIG. 6, there is shown a flat display panel 44 made up of a plurality of the arrays 40. The display panel 44 comprises a pair of flat plates 46 and 48 of an electrically insulating material, such as a plastic or glass. The top plate 46 should also be optically transparent. The plates 46 and 48 are arranged in spaced, parallel relation. Between the plates 46 and 48 are mounted a plurality of the arrays 40 in parallel relation with each array being as close as possible to the adjacent arrays. By coating the back surface of the metal strip 42 of each array 40 with an electrical insulating material, the arrays can be arranged with the electroluminescent semiconductor devices 100 of each array contacting the insulating layer on the back of the metal strip of the adjacent array. The arrays 40 are arranged so that the insulating gallium nitride body 118 of each electroluminescent semiconductor device 100 is adjacent to the top plate 46, and the electroluminescent semiconductor devices 100 of adjacent arrays 40 are disposed in rows transversely of the arrays.

A first set of a plurality of spaced, parallel, metal film conductors 50 are provided on the inner surface of the top plate 46. Each of the conductors 50 extends along a transverse row of the electroluminescent semiconductors 100 and engages the metal balls 124a on the contact pads **122*a* of the electroluminescent semiconductor devices 100 in a transverse row. A second set of a plurality of spaced, parallel, metal film conductors 52 are provided on the inner surface of the top plate 46. The second set of conductors 52 are parallel to and alternate with the first set of conductors 50. Each of the conductors 52 engages the metal balls 124*b* on the contact pads 122*b* of the electroluminescent semiconductor devices 100 in a transverse row. A third set of a plurality of spaced, prallel, metal film conductors 54 are provided on the inner surface of the bottom plate 48. Each of the conductors 54 of the third set extends along a transverse row of the electroluminescent semiconductor devices 100 and engages the metal ball contacts 134 on the diodes 126 of the electroluminescent semiconductor devices in the transverse row. Thus, in each transverse row of the electroluminescent semiconductor devices 100, the contact pads 122*a* are all electrically connected to a common conductor 50, the contact pads 122*b* are all electrically connected to a common conductor 52 and the contacts 134 are all electrically connected to a common conductor 54.**

The conductors 50, 52 and 54 and the metal strips 42 of the arrays 40 are connected to a source of D.C. current through suitable switching means. By applying a voltage between one or more of the metal strips 42 and one or more of the various conductors 50, 52 and 54, one or more of the electroluminescent semiconductor devices 100 can be energized to emit a desired color of light which can be seen through the top plate 46 of the display 44. The electroluminescent semiconductor devices 100 can be energized so that the emitted light forms a desired pattern. The pattern of the emitted light can be all of one of the three colors or can be portions of each of the three colors. Thus, the display panel 44 can provide a multi-color pattern of the light emitted by the electroluminescent semiconductor devices the brightness of each device is controlled by the intensity of the current therethrough.

I claim:

1. An electroluminescent semiconductor device capable of emitting light of at least three different wavelengths comprising:

a flat substrate of an electrical insulating and optically transparent material, a first body of a crystalline insulating nitride of gallium on one side of said substrate, said first body being capable of emitting light when a voltage is placed thereacross, with the emitted light being of one wavelength when the voltage is in one direction across the body, and being of a second wavelength when the voltage is in the opposite direction, a second body of a semiconductor material on the opposite side of said substrate, said second body being capable of emitting light of a third wavelength when a voltage is placed thereacross, which light is visible through said first body, and means whereby a voltage can be placed across each of said bodies.

2. An electroluminescent semiconductor device in accordance with claim 1 in which the means whereby a voltage can be placed across each of said bodies includes a first contact connected to said first body, a second contact connected to said second body, and a third contact connected to both the first and second bodies in spaced relation to each of the first and second contacts.

3. An electroluminescent semiconductor device in accordance with claim 2 including a third body of electrically conductive gallium nitride on said one side of the substrate and said first body is on the third body.

4. An electroluminescent semiconductor device in accordance with claim 3 in which the second body is of a group III–V compound and mixtures thereof and has juxtaposed portions of opposite conductivity to provide a PN junction therein, the second contact is connected to one portion of the second body and the third contact is connected to the other portion of the second body.

5. An electroluminescent semiconductor device in accordance with claim 4 in which the third contact extends between and is connected to the third body and the other portion of the second body.

6. An electroluminescent semiconductor device in accordance with claim 5 in which the third contact is a metal strip which extends across an edge of the substrate and is secured to an edge of the third body and the other portion of the second body.

7. An electroluminescent semiconductor device in accordance with claim 6 in which the first contact is on the surface of the first body and a fourth contact is on the surface of the first body spaced from the first contact.

8. An array of a plurality of electroluminescent semiconductor devices each in accordance with claim 7 wherein the metal strip is elongated and a plurality of the electroluminescent semiconductor devices are mounted in spaced relation along said metal strip.

9. A display panel including a plurality of arrays each in accordance with claim 8 with the arrays being in parallel relation between two spaced, parallel plates of electrical insulating material, said arrays being positioned with the electroluminescent semiconductor devices arranged in parallel rows longitudinally along the metal strips and in parallel rows transversely of the metal strips, a plurality of spaced, parallel metal conductors on the inner surface of each of said plates with each conductor extending along a corresponding transverse row of the electroluminescent semiconductor devices, each of the conductors on one of the plates engaging the first contact on the electroluminescent semiconductor devices in its corresponding transverse row and each of the conductors on the other plate engaging the second contact on the electroluminescent semiconductor devices in its corresponding transverse row.

10. A display panel in accordance with claim 9 in which the plate which is adjacent the first body of the electroluminescent semiconductor devices is optically transparent.

* * * * *

UNITED STATES PATENT OFFICE
CERTIFICATE OF CORRECTION

Patent No. 3,783,353 Dated January 1, 1974

Inventor(s) Jacques Isaac Pankove

It is certified that error appears in the above-identified patent and that said Letters Patent are hereby corrected as shown below:

Column 2, line 27, change "(1960)" to --(1969)--

Column 3, line 55, change "112a" to --122a--

Signed and sealed this 9th day of July 1974.

(SEAL)
Attest:

McCOY M. GIBSON, JR.
Attesting Officer

C. MARSHALL DANN
Commissioner of Patents